US006794214B2

(12) United States Patent
Berezin et al.

(10) Patent No.: US 6,794,214 B2
(45) Date of Patent: Sep. 21, 2004

(54) LOCK IN PINNED PHOTODIODE PHOTODETECTOR

(75) Inventors: Vladimir Berezin, La Crescenta, CA (US); Alexander Krymski, Montrose, CA (US); Eric R. Fossum, LaCrescenta, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/867,846

(22) Filed: May 29, 2001

(65) Prior Publication Data

US 2001/0052605 A1 Dec. 20, 2001

Related U.S. Application Data

(63) Continuation of application No. 09/378,565, filed on Aug. 19, 1999, now Pat. No. 6,239,456.

(60) Provisional application No. 60/097,135, filed on Aug. 19, 1998.

(51) Int. Cl.[7] .......................................... H01L 31/101

(52) U.S. Cl. ............................ 438/57; 438/59; 438/73; 438/78; 257/232; 257/233; 257/292; 372/50

(58) Field of Search ................................ 257/232, 233, 257/292, 290, 291, 461; 372/50, 26, 38, 45; 438/59, 73, 78

(56) References Cited

U.S. PATENT DOCUMENTS

| | | | | | |
|---|---|---|---|---|---|
| 5,043,568 | A | * | 8/1991 | Tsuchiya et al. | 250/214 VT |
| 5,099,694 | A | * | 3/1992 | Sumio et al. | 73/654 |
| 5,179,565 | A | * | 1/1993 | Tsuchiya et al. | 372/26 |
| 5,497,390 | A | * | 3/1996 | Tanaka et al. | 372/50 |
| 5,880,495 | A | * | 3/1999 | Chen | 257/233 |
| 6,100,551 | A | * | 8/2000 | Lee et al. | 257/232 |
| 6,127,697 | A | * | 10/2000 | Guidash | 257/233 |

* cited by examiner

*Primary Examiner*—David Nelms
*Assistant Examiner*—Dao H. Nguyen
(74) *Attorney, Agent, or Firm*—Dickstein Shapiro Morin & Oshinsky LLP

(57) ABSTRACT

A lock in pinned photodiode photodetector includes a plurality of output ports which are sequentially enabled. Each time when the output port is enabled is considered to be a different bin of time. A specified pattern is sent, and the output bins are investigated to look for that pattern. The time when the pattern is received indicates the time of flight.

25 Claims, 4 Drawing Sheets

LOCK IN PINNED PHOTODIODE PHOTODETECTOR

CROSS REFERENCE TO RELATED APPLICATIONS

This application is a continuation of U.S. patent application Ser. No. 09/378,565, filed Aug. 19, 1999 now U.S. Pat. No. 6,239,456, which claims the benefit of the U.S. Provisional Application No. 60/097,135, filed on Aug. 19, 1998, which is incorporated herein by reference.

BACKGROUND

Certain applications require measuring aspects that are based on the speed of light.

For example, range finding can be carried out using optics. An optical signal is sent. The reflection therefrom is received. The time that it takes to receive the reflection of the optical signal gives an indication of the distance.

The so called lock-in technique uses an encoded temporal pattern as a signal reference. The device locks into the received signal to find the time of receipt. However, noise can mask the temporal pattern.

A lock in photodetector based on charged coupled devices or CCDs has been described in Miagawa and Kanada "CCD based range finding sensor" IEEE Transactions on Electronic Devices, volume 44 pages 1648–1652 1997.

CCDs are well known to have relatively large power consumption.

SUMMARY

The present application describes a special kind of lock in detector formed using CMOS technology. More specifically, a lock in detector is formed from a pinned photodiode. The photodiode is modified to enable faster operation.

It is advantageous to obtain as much readout as possible to maximize the signal to noise ratio. The pinned photodiode provides virtually complete charge transfer readout.

Fast separation of the photo-generated carriers is obtained by separating the diode into smaller sub-parts and summing the output values of the subparts to obtain an increased composite signal.

BRIEF DESCRIPTION OF THE DRAWINGS

These an other aspects will now be described in detail with reference to the accompanying drawings, wherein.

DESCRIPTION OF THE PREFERRED EMBODIMENT

The present application uses a special, multiple output port pinned photodiode as the lock in pixel element. The photodiode is preferably part of a CMOS active pixel image sensor, of the type described in U.S. Pat. No. 5,471,505. Hence, the system preferably includes in-pixel buffer transistors and selection transistors, in addition to the CMOS photodetector.

Figure 1:
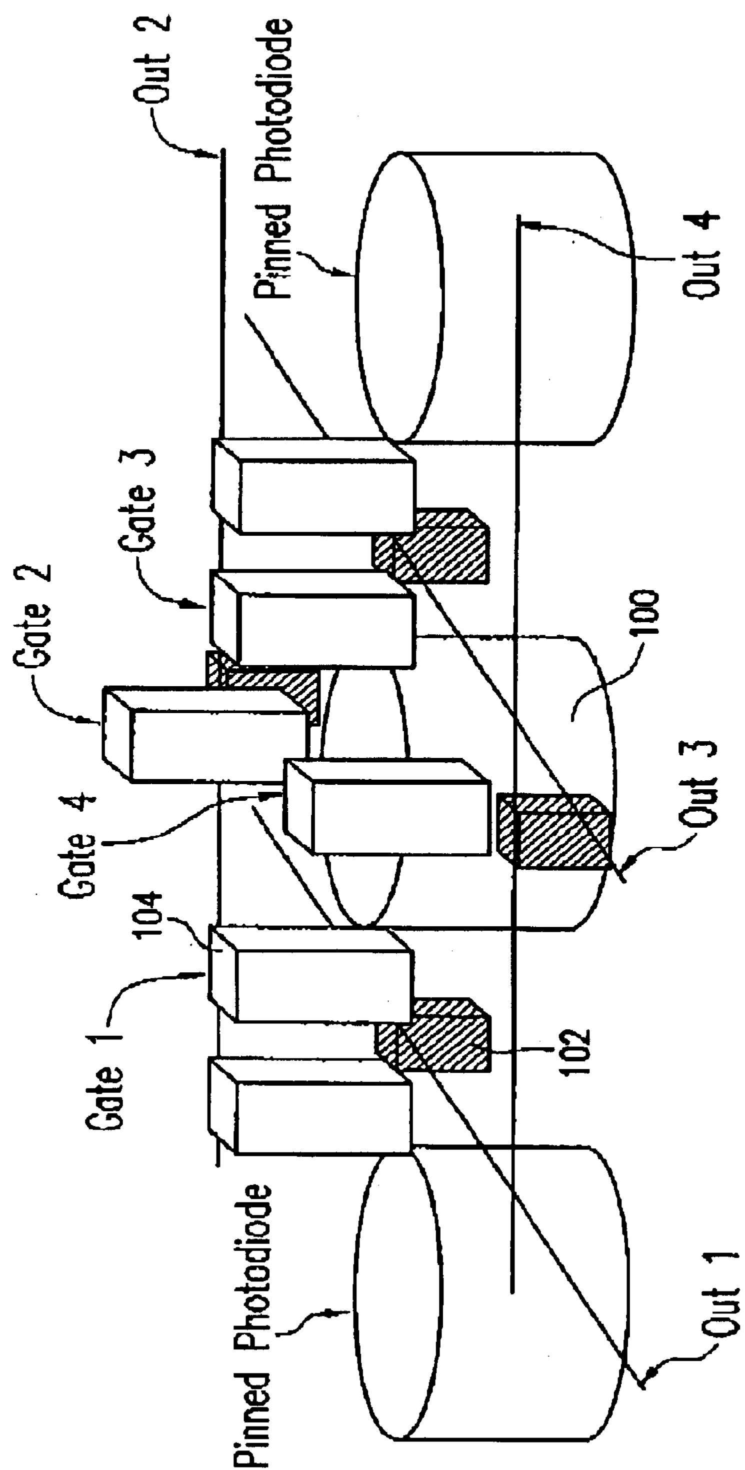
FIG. 1 shows a basic block diagram of the system.

FIG. 1 shows a pinned photodiode with four output ports, labeled as out1-out4. Each of the output ports is used to receive a reflection for a specified time duration. Each output becomes a "bin". The counting of the amount of information in the bins enables determination of the reflection time, and hence the range.

Pinned photodiodes are well known in the art and described in U.S. Pat. No. 5,904,493. A pinned photodiode is also known as a hole accumulation diode or HAD, or a virtual phase diode or VP diode. Advantages of these devices are well known in the art. They have small dark current due to suppression of surface generation. They have good quantum efficiency since there are few or no polysilicon gates over the photosensitive region. Pinned photodiodes can also be made into smaller pixels because they have fewer gates.

The basic structure of the pinned photodiode lock in pixel is shown in FIG. 1. Four switched integrators are formed respectively at four output ports. Each gate is enabled during a specified period. The different integrators integrate carriers accumulated during the different periods. The first integrator accumulates carriers between 0 and $\pi/2$, the second between $\pi/2$ and $\pi$, the third between $\pi$ and $3\pi/2$ and the fourth between $3\pi/2$ and $2\pi$time slots.

Assuming the light to be a cosine phase, then the phase shift of the detected light is given by $$\arctan[(L1-L3)/(L2-L4)],$$

where L1, L2, L3 and L4 are the amplititudes of the samples from the respective first, second, third and fourth integrators. These four phases are obtained from the four outputs of the photodiode.

The first pinned photodiode 100 is connected to an output drain 102 via gate 1, element 104. This receives the charge for the first bin. Similarly, gates 2, 3 and 4 are turned on to integrate/bin from the second, third and fourth periods.

It is important to obtain as much signal as possible from the photodiode. This can be done by using a large photodiode. However, it can take the electrons a relatively long time to escape from a large photodetector.

Figure 2:
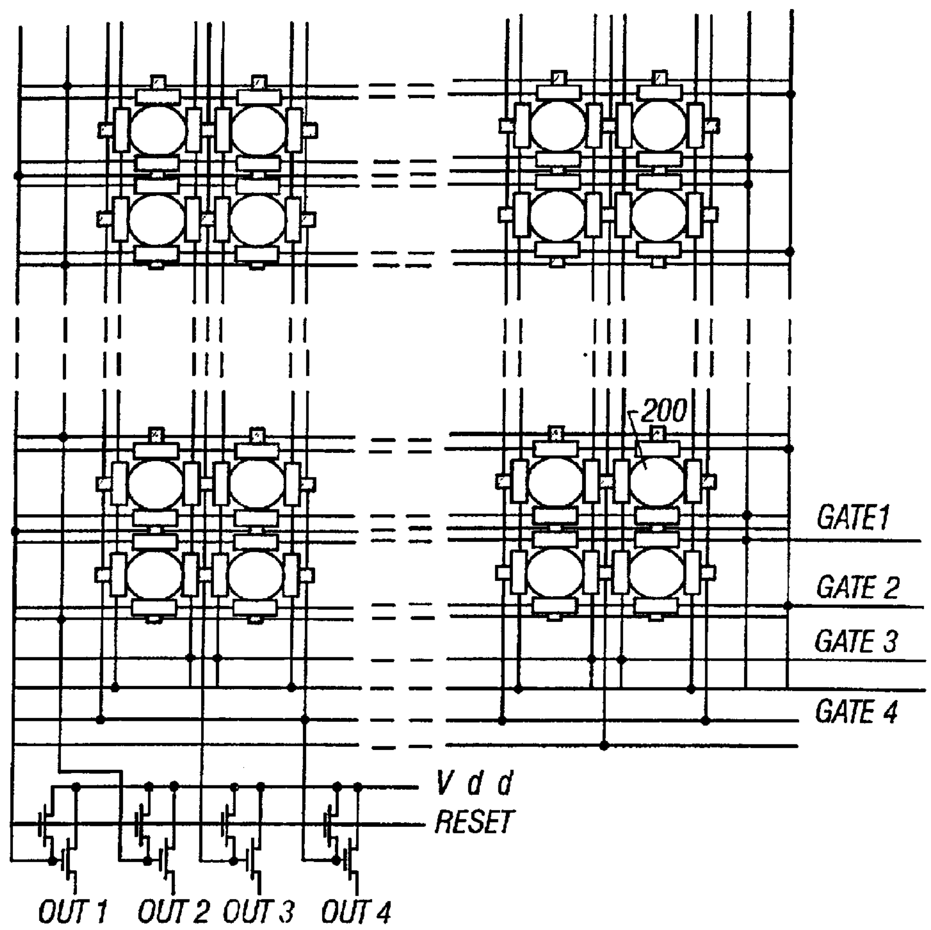
FIG. 2 shows a block diagram of the multiple photodiode parts.

The present system divides the one larger photodiode into a number of smaller diodes, each with multiple output ports. FIG. 2 shows the system.

A number of subpixels are formed. Each includes a number of pinned photodiodes 200, each with four ports. Each of the corresponding ports are connected together in a way that allows summing the outputs of the photodiodes. For example, all the gate 1 control lines are connected together as shown. The outputs from all the port 1*s* are also summed, and output as a simple composite output. Similarly, ports 2, 3 and 4's are all summed.

Figure 3:
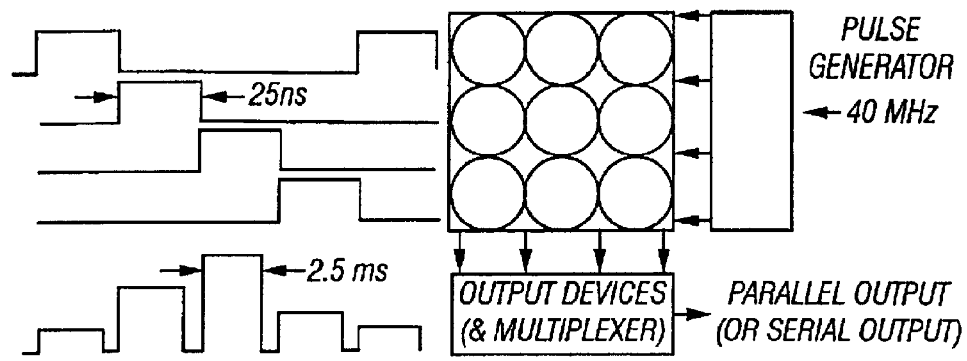
FIG. 3 shows a block diagram of the system as used in range finding.

FIG. 3 shows the circuit and driving waveforms for the system when used as a range finder. A pulse generator drives selection of the active output. Each time period is separately accumulated, and output. If a 40 MHZ pulse generator is used, 25 ns resolution can be obtained.

Figure 4A:
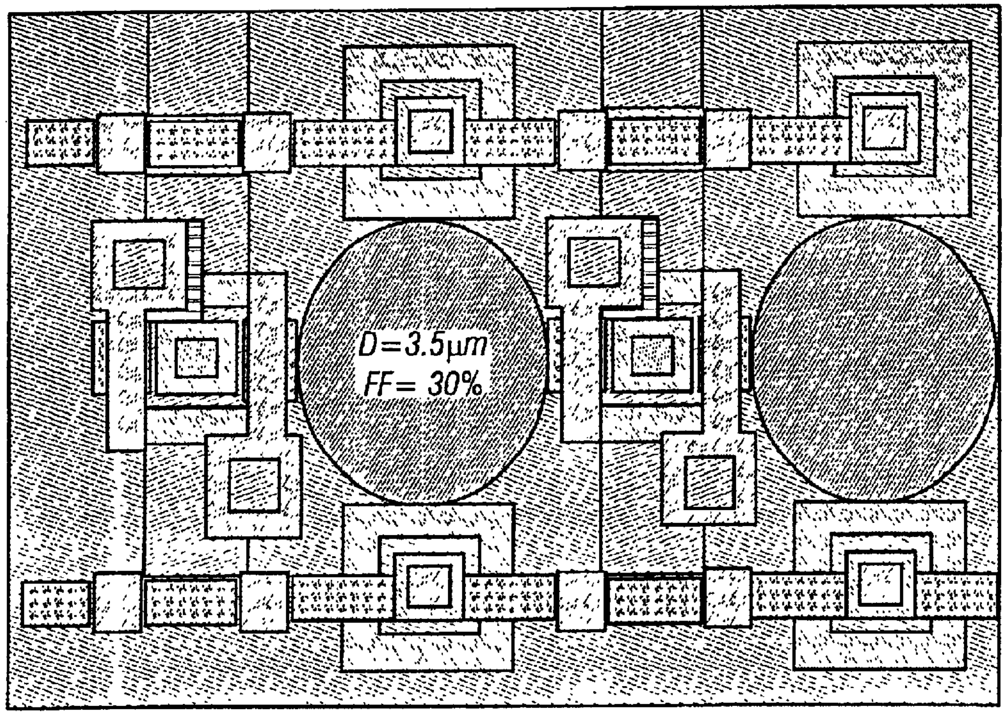
FIG. 4*a* and 4*b* show pixel layouts.
Figure 4B:
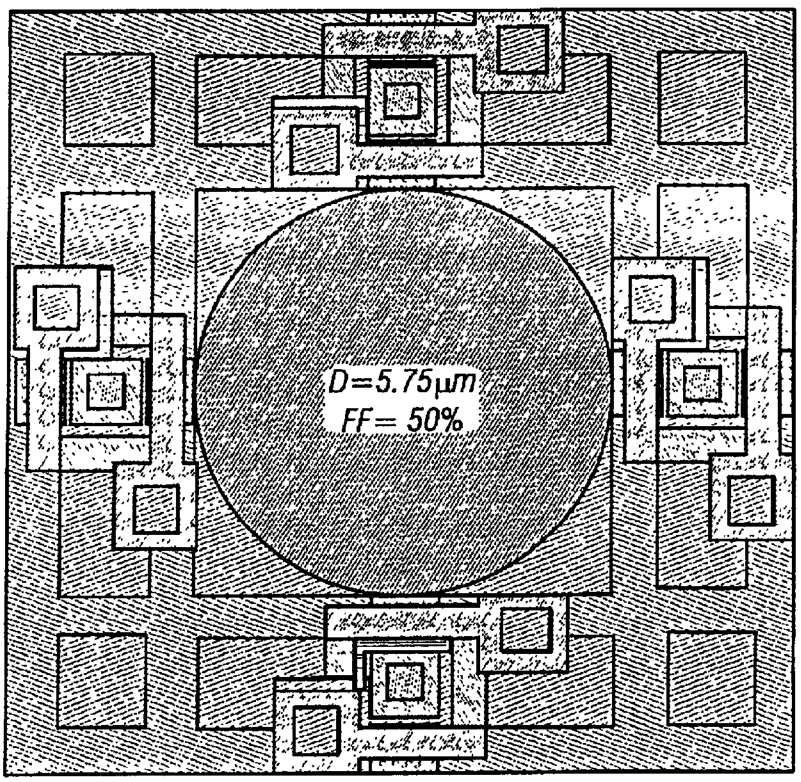

FIGS. 4A and 4B show representative pixel layouts. FIG. 4A shows a 6 by 6 square micron pixel layout while FIG. 4B shows an 8½ by 8½ micron pixel layout. In both Figures, four outputs are shown.

Figure 5:
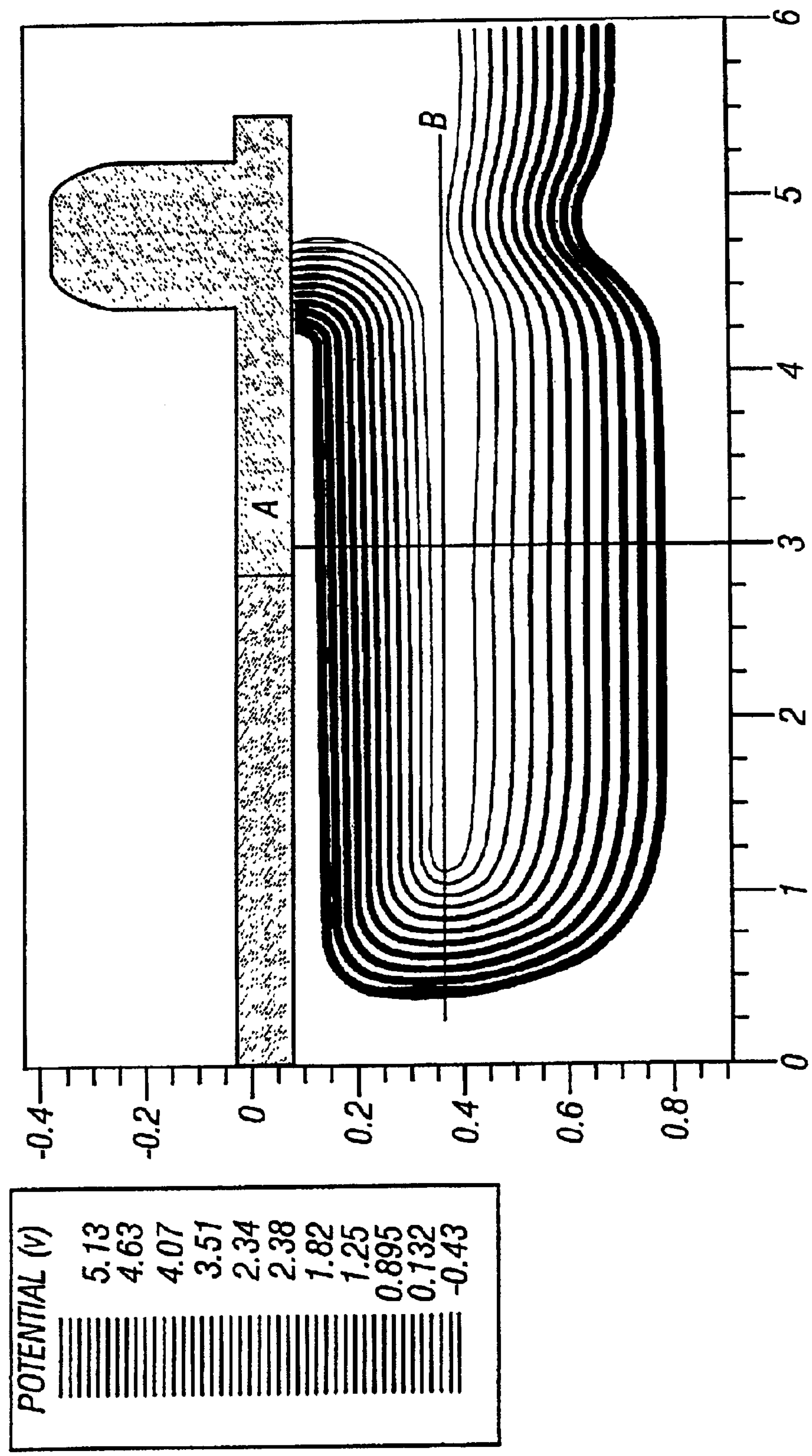
FIG. 5 shows a cross section of the pinned photodiode.

FIG. 5 shows a cross sectional potential diagram of an exemplary pinned photodiode.

Assuming the operation frequency of modulated light is 10 megahertz with a 25 nanosecond integration slot, the generator carrier has a time of flight within this limit. This resolution time constrains the size of the detector. In addition, the characteristic diffusion time in a semiconductor device is $L^2/D$, where D is the diffusion coefficient. This time originates from the continuity equation and the diffusion equation, and defines how soon the steady state will be established in the area of size L. Hence, for a 10 cm square per second electron diffusion coefficient, the characteristic size of the pinned photodiode could be less than 5 microns.

Other embodiments are also contemplated to exist within this disclosure. For example, other numbers of output ports, e.g. 2-8, are possible. While this application describes using a pinned photodiode, similar operations could be carried out with other CMOS photodetectors, e.g., photodiodes and photogates.

Such modifications are intended to be encompassed within the following claims.

What is claimed is:

1. A method, comprising:

accumulating photocarriers in each of a plurality of photocarrier integrators and successively enabling each of said plurality of photocarrier integrators to connect to a common photodiode, each of said photocarrier integrators connecting to said common photodiode through a respective photodiode output port, said plurality of photocarrier integrators accumulating photocarriers generated by said photodiode during different time periods from one another.

2. A method as in claim 1, wherein said enabling comprises actuating a gate that is connected between each said photocarrier integrator and said photodiode.

3. A method as in claim 2, further comprising, after said enabling, detecting a number of carriers accumulated in said photodiode during at least two of said time periods by detecting the number of photocarriers accumulated in at least two said photocarrier integrators.

4. A method as an claim 2, wherein said photodiode is a pinned photodiode, and further comprising, after said enabling, detecting a number of carriers accumulated in said pinned photodiode during at least two of said time periods by decting the number of photocarriers accumulated in at least two said photocarrier integrators.

5. A method as in claim 1, wherein there are four of said photocarrier integrators, and said successively enabling comprises using a first photocarrier integrator to accumulate photocarrier between times 0 and $\pi/2$, a second photocarrier integrator to accumulate photocarriers between times $\pi/2$ and $\pi$; a third photocarrier integrator to accumulate photocarriers between times $\pi$ and $3\pi/2$, and a fourth photocarrier integrator to accumulate photocarriers between times $3\pi/2$ and $2\pi$.

6. A method as in claim 1, further comprising detecting a phase shift of light received by said photodiode by detecting accumulated charge in at least two photocarrier integrators.

7. A method, comprising:

generating photocarriers in a photodiode within a pixel during a plurality of time periods;

accumulating photocarriers in each of a plurality of photocarrier integrators within said pixel such that each photocarrier integrator accumulates photocarriers generated during a time period different from a time period in which other photocarrier integrators accumulate photocarriers; and sampling said photocarriers from said photocarrier integrators;

determining a range of an object using said sampled photocarriers.

8. A method as in claim 7, further comprising controlling each of said photocarrier integrators to be connected to said photodiode during said different time period.

9. A method as in claim 8, wherein said controlling comprises enabling a gate, said gate being connected to said photodiode and to one of said photocarrier integrators.

10. A method as in claim 9, wherein there are four of said photocarrier integrators, and wherein said enabling comprises successively enabling a first photocarrier integrator to accumulate photocarriers between times 0 and $\pi/2$, a second photocarrier integrator to accumulate photocarriers between times $\pi/2$ and $\pi$; a third photocarrier integrator to accumulate photocarriers between times $\pi$ and $3\pi/2$, and a fourth photocarrier integrator to accumulate photocarriers between times $3\pi/2$ and $2\pi$.

11. A method as in claim 7, wherein there are four of said photocarriers integrators, and said sampling comprises sampling photo carriers which are 90 degrees out of phase with one another.

12. A method, comprising:

sampling a plurality of different samples of light in a photodiode, each of said plurality of different samples being 90 degrees out of phase with one another; and successively garing photocarriers representing each of said different samples from said photodiode through a respective output port, each output port associated with a respective photocarrier integrator, such that each photocarrier integrator accumulates a different sample than other of said photocarrier integrators.

13. A method as in claim 12, further comprising detecting a phase shift using said samples of light.

14. A method as in claim 12, wherein there are four different gates connected to said photodiode each gating a different sample.

15. A method as in claim 12, wherein there are four photocarrier integrators, and wherein said act of gating comprises successively enabling a first photocarrier integrator to accumulate photocarriers between times 0 and $\pi/2$, a second photocarrier integrator to accumulate photocarriers between times $\pi/2$ and $\pi$; a third photocarrier integrator to accumulate photocarriers between times $\pi$ and $3\pi/2$, and a fourth photocarrier integrator to accumulate photocarriers between times $3\pi/2$ and $2\pi$.

16. A method of operating a range finding sensor, the method comprising;

providing a plurality of photodiodes, each photodiode having a first output port for switchably coupling each respective photodiode to a first photocarrier integrator in a same pixel as said photodiode and a second output port for switchably coupling each photodiode to a second photocarrier integrator in a same pixel as said photodiode;

generating first photocarriers in said photodiodes in response to light received during a first time period;

transferring said first photocarriers to respective first photocarrier integrators via said first output ports;

generating second photocarriers in said photodiodes in response to light received during a second time period; and transferring said second photocarriers to respective second photocarrier integrators via said second output ports.

17. The method of claim 16, further comprising outputting said first photocarriers from first photocarrier integrators and outputting said second photocarriers from second photocarrier integrators.

18. The method of claim 17, wherein the act of outputting said first photocarriers comprises summing outputs of all of said first photocarrier integrator, and wherein the act of outputting said second photocarriers comprises summing outputs of all of said second photocarrier integrators.

19. The method of claim 16, further comprising counting the amount of photocarriers in said first photocarriers integrator and counting the amount of said second photocarriers in said second photocarrier integrator.

20. The method of claim 19, further comprising determining a range of an object using the results of said acts of counting.

21. The method of claim 16, wherein said act of providing a plurality of photodiodes includes providing said plurality of photodiodes within a common pixel.

22. The method of claim 16, wherein said act of transferring said first photocarriers comprises transferring said first photocarriers to respective first output drains by operating first gates connected to said photodiodes and said first output drains, and wherein said act of transferring said second photocarriers comprises transferring said second photocarriers to respective second output drains by operating second gates connected to said photodiodes and said second output drains.

23. The method of claim 16, wherein each photodiode further has a third output port for switchably coupling each photodiode to a third photocarrier integrator in a same pixel as said photodiode and a fourth output port for switchably coupling each photodiode to a fourth photocarrier integrator in a same pixel as said photodiode, and further comprising:

generating third photocarriers in said photodiodes in response to light received during a third time period;

transferring said third photocarriers to respective third photocarrier integrators via said third output ports;

generating fourth photocarriers in said photodiodes in response to light received during a fourth time period; and transferring said fourth photocarriers to respective fourth photocarrier integrators via said fourth output ports.

24. The method of claim 23, further comprising outputting said first photocarriers from said first photocarrier integrators, outputting said second photocarriers from said second photocarrier integrators, outputting said third photocarriers from said third photocarrier integrators, and outputting said fourth photocarriers from said fourth photocarrier integrators.

25. The method of claim 24, wherein the act of outputting said first photocarriers comprises summing outputs of all of said first photocarrier integrators, wherein the act of outputting said second photocarriers comprises summing outputs of all of said second photocarrier integrators, wherein the act of outputting said third photocarriers comprises summing outputs of all of said third photocarrier integrators, and wherein the act of outputting said fourth photocarriers comprises summing outputs of all of said fourth photocarrier integrators.

* * * * *

UNITED STATES PATENT AND TRADEMARK OFFICE

CERTIFICATE OF CORRECTION

PATENT NO. : 6,794,214 B2
DATED : September 21, 2004
INVENTOR(S) : Vladimir Berezin et al.

It is certified that error appears in the above-identified patent and that said Letters Patent is hereby corrected as shown below:

Column 4,
Line 18, "garing" should read -- gating --; and
Line 63, "integrator" should read -- integrators --.

Signed and Sealed this

Thirteenth Day of December, 2005

JON W. DUDAS
*Director of the United States Patent and Trademark Office*